(12) United States Patent
Lee

(10) Patent No.: US 9,978,436 B2
(45) Date of Patent: May 22, 2018

(54) REFRESH VERIFICATION CIRCUIT, SEMICONDUCTOR APPARATUS AND SEMICONDUCTOR SYSTEM

(71) Applicant: SK hynix Inc., Incheon-si, Gyeonggi-do (KR)

(72) Inventor: Yongwoo Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days. days.

(21) Appl. No.: 15/497,451

(22) Filed: Apr. 26, 2017

(65) Prior Publication Data

US 2017/0229164 A1     Aug. 10, 2017

Related U.S. Application Data

(62) Division of application No. 15/053,407, filed on Feb. 25, 2016, now Pat. No. 9,666,260.

(30) Foreign Application Priority Data

Jul. 13, 2015   (KR) .................. 10-2015-0099379

(51) Int. Cl.
| | | |
|---|---|---|
| *G11C 7/00* | (2006.01) | |
| *G11C 11/406* | (2006.01) | |
| *G06F 11/10* | (2006.01) | |
| *G11C 11/4091* | (2006.01) | |
| *G11C 11/4076* | (2006.01) | |

(52) U.S. Cl.
CPC .... *G11C 11/40615* (2013.01); *G06F 11/1004* (2013.01); *G11C 11/4076* (2013.01); *G11C 11/4091* (2013.01)

(58) Field of Classification Search
CPC .......... G11C 11/40615; G11C 11/4091; G11C 11/4076; G06F 11/1004
USPC .................................... 365/222, 203
See application file for complete search history.

(56) References Cited

U.S. PATENT DOCUMENTS

| | | | | |
|---|---|---|---|---|
| 5,432,747 | A * | 7/1995 | Fuller ...................... | G11C 7/12 365/189.05 |
| 5,953,279 | A | 9/1999 | Kim et al. | |
| 8,368,621 | B2 * | 2/2013 | Takasugi .............. | G09G 3/3233 315/169.3 |
| 9,384,817 | B1 | 7/2016 | Kim | |
| 9,389,953 | B2 * | 7/2016 | Choi .................... | G06F 11/1048 |
| 9,666,260 | B2 * | 5/2017 | Lee ....................... | G11C 11/401 |
| 2002/0176300 | A1 | 11/2002 | Tsukude | |
| 2003/0151964 | A1 | 8/2003 | Takahashi et al. | |
| 2003/0217321 | A1 * | 11/2003 | Hsu ...................... | G11C 15/043 714/763 |
| 2005/0041520 | A1 | 2/2005 | Takahashi et al. | |
| 2005/0204274 | A1 * | 9/2005 | Kamp ................. | G06F 11/1048 714/801 |
| 2005/0210186 | A1 * | 9/2005 | Arakawa ............... | G06F 11/106 711/106 |

(Continued)

FOREIGN PATENT DOCUMENTS

| | | |
|---|---|---|
| KR | 1020060119129 A | 11/2006 |
| KR | 1020120005233 A | 1/2012 |

*Primary Examiner* — Viet Q Nguyen
(74) *Attorney, Agent, or Firm* — William Park & Associates Ltd.

(57) ABSTRACT

A refresh verification circuit may include a filtering circuit configured to receive a refresh pulse and to generate a filtering pulse in response to a duration of the enable period of the refresh pulse.

5 Claims, 7 Drawing Sheets

(56) References Cited

U.S. PATENT DOCUMENTS

| | | |
|---|---|---|
| 2006/0023546 A1 | 2/2006 | Park |
| 2006/0092741 A1 | 5/2006 | Kim et al. |
| 2006/0146628 A1 | 7/2006 | Cho |
| 2006/0209611 A1 | 9/2006 | Tsukude |
| 2007/0058474 A1 | 3/2007 | Sohn et al. |
| 2007/0121407 A1 | 5/2007 | Lee |
| 2007/0253270 A1 | 11/2007 | Do |
| 2008/0062798 A1 | 3/2008 | Kim et al. |
| 2008/0239854 A1 | 10/2008 | Tomita |
| 2008/0259709 A1 | 10/2008 | Chi |
| 2008/0316848 A1 | 12/2008 | Ohsawa |
| 2009/0161456 A1 | 6/2009 | Sakakibara |
| 2010/0302883 A1 | 12/2010 | Kim et al. |
| 2011/0138261 A1* | 6/2011 | Bains ............... G06F 11/1016 714/800 |
| 2011/0307769 A1* | 12/2011 | Ramaraju ......... G06F 11/1064 714/801 |
| 2012/0230139 A1* | 9/2012 | Son .................... G11C 11/4091 365/203 |
| 2012/0307582 A1 | 12/2012 | Marumoto et al. |
| 2014/0189215 A1 | 7/2014 | Kang et al. |
| 2014/0250353 A1* | 9/2014 | Choi ................. G06F 11/1048 714/800 |
| 2014/0269139 A1 | 9/2014 | Wang |
| 2016/0111140 A1 | 4/2016 | Joo et al. |

\* cited by examiner

FIG.4
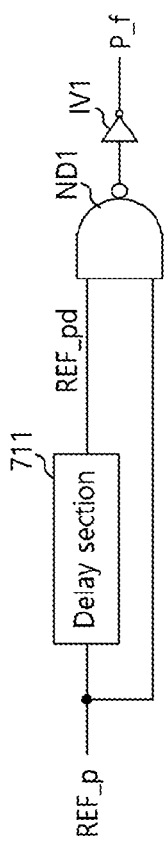
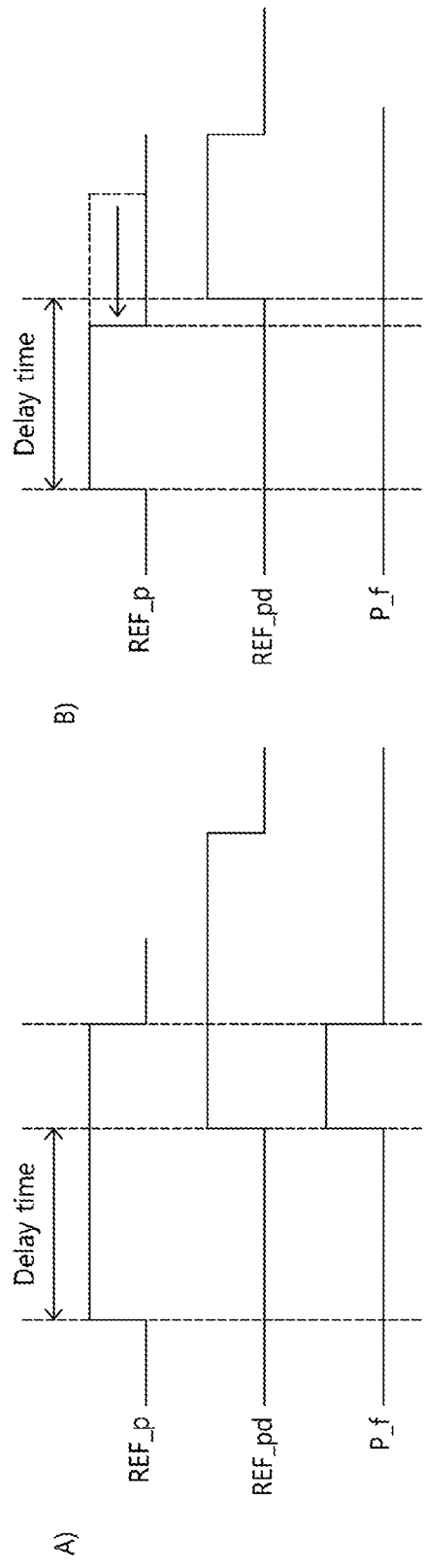

REFRESH VERIFICATION CIRCUIT, SEMICONDUCTOR APPARATUS AND SEMICONDUCTOR SYSTEM

CROSS-REFERENCES TO RELATED APPLICATION

The present application is a divisional application of U.S. application Ser. No. 15/053,407, filed on Feb. 25, 2016, which is incorporated herein by reference in its entirety.

BACKGROUND

1. Technical Field

Various embodiments generally relate to a semiconductor integrated circuit, and, more particularly, to a refresh verification circuit, a semiconductor apparatus and a semiconductor system.

2. Related Art

Semiconductor apparatuses store data and output the stored data. Among semiconductor apparatuses which store data, a semiconductor apparatus which stores data by using a capacitor is a volatile semiconductor apparatus. Volatile semiconductor apparatuses require a refresh operation to retain the data.

Therefore, for retaining data in the semiconductor apparatuses which store data by using capacitors, it is necessary to verify the refresh operation of the semiconductor apparatuses.

SUMMARY

In an embodiment, a refresh verification circuit may be provided. The refresh verification circuit may include a filtering circuit configured to receive a refresh pulse and to generate a filtering pulse in response to a duration of the enable period of the refresh pulse.

In an embodiment, a semiconductor apparatus may be provided. The semiconductor apparatus may include a refresh control circuit configured to generate a refresh pulse in response to a refresh command and a precharge signal. The semiconductor apparatus may include a precharge signal generation circuit configured to generate the precharge signal according to a parity check result for a first signal. The semiconductor apparatus may include a refresh verification circuit configured to generate a result signal in response to the refresh pulse and the refresh command.

In an embodiment, a semiconductor system may be provided. The semiconductor system may include a plurality of semiconductor apparatuses each configured to generate a precharge signal according to a parity check result for a first signal, generate a refresh pulse in response to a refresh command and the precharge signal, and generate a result signal in response to the refresh command and the refresh pulse. The semiconductor system may include a signal combination block configured to generate a refresh verification signal in response to result signals respectively outputted from the plurality of semiconductor apparatuses. The semiconductor system may include an external device configured to be inputted with the refresh verification signal.

In an embodiment, a semiconductor system may be provided. The semiconductor system may include a semiconductor apparatus including a parity check circuit which is configured to perform a parity check for a first signal and a refresh control circuit which is configured to generate a refresh pulse in response to a refresh command and a result of the parity check. The semiconductor system may include a refresh verification circuit configured to generate a result signal in response to the refresh command and the refresh pulse, and transfer a result signal to an external device.

In an embodiment, a semiconductor system may be provided. The semiconductor system may include a plurality of semiconductor apparatuses each configured to generate a refresh pulse in response to a refresh signal and a parity check result for a first signal. The semiconductor system may include a refresh verification circuit configured to generate a refresh verification signal in response to refresh signals and refresh pulses respectively outputted from the plurality of semiconductor apparatuses, and output the refresh verification signal to an external device.

In an embodiment, a refresh verification circuit may include a comparison circuit configured to compare a number of times by which a normally disabled refresh pulse, excluding abnormally disabled refresh pulses, is inputted to the refresh verification circuit with a number of times by which a refresh command is received by the refresh verification circuit, and to output a result signal.

BRIEF DESCRIPTION OF THE DRAWINGS

FIG. 4 is of a configuration diagram and a timing diagram of a representation of an example of the filtering circuit illustrated in FIG. 1.

DETAILED DESCRIPTION

Hereinafter, a refresh verification circuit, a semiconductor apparatus and a semiconductor system will be described below with reference to the accompanying drawings through various examples of embodiments.

Figure 1:
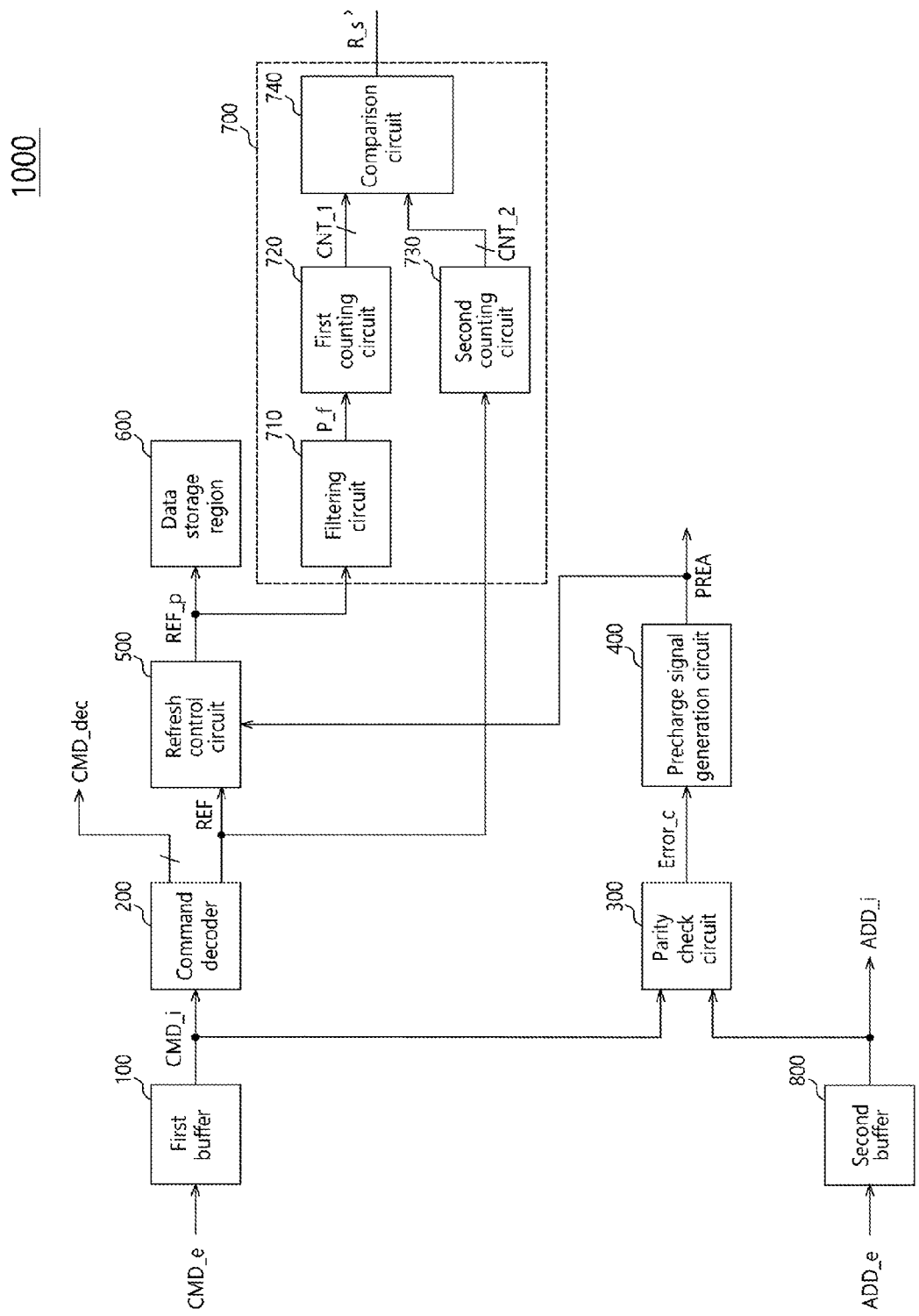
FIG. 1 is a configuration diagram illustrating a representation of an example of a semiconductor apparatus including a refresh verification circuit in accordance with an embodiment.

Referring to FIG. 1, a semiconductor apparatus 1000 including a refresh verification circuit in accordance with an embodiment may include a first buffer 100, a command decoder 200, a parity check circuit 300, a precharge signal generation circuit 400, a refresh control circuit 500, a data storage region 600, a refresh verification circuit 700, and a second buffer 800.

The first buffer 100 may be configured to buffer an external command CMD_e and output an internal command CMD_i. For example, the first buffer 100 as a buffer for a command buffers the external command CMD_e inputted from outside the semiconductor apparatus 1000, to a voltage level to be used inside the semiconductor apparatus 1000, and outputs the internal command CMD_i. While only the one first buffer 100 as a buffer for a command is illustrated in the semiconductor apparatus 1000 in accordance with an embodiment, it is to be noted that the semiconductor apparatus 1000 in accordance with an embodiment may be configured by a plurality of buffers which buffer all the operation control signals inputted from a controller to the semiconductor apparatus 1000, for example but not limited to, a write enable signal (WE), a column address strobe signal (CAS), a row address strobe signal (RAS) and a clock enable signal (CKE).

The command decoder 200 may be configured to decode the internal command CMD_i outputted from the first buffer 100 and output a decoding command CMD_dec. The decoding command CMD_dec as signals for commanding operations of the semiconductor apparatus 1000 may include, for example but not limited to, a read command, a write command, an active command and a refresh command. Since the semiconductor apparatus 1000 in accordance with an embodiment relates to a refresh operation, only a refresh command REF as a part of the decoding command CMD_dec is separately illustrated. A time when the refresh command REF is inputted may be referred to as a time when a refresh signal REF is enabled, with the same meaning.

The parity check circuit 300 may be configured to perform a parity check operation for the internal command CMD_i and generate an error check signal Error_c. For example, the parity check circuit 300 determines whether the number of high levels which the respective bits of the internal command CMD_i have is odd or even, and generates the error check signal Error_c. For example, when the number of high levels which the respective bits of the internal command CMD_i have is odd although it should be even, the parity check circuit 300 determines a command error and enables the error check signal Error_c. For example, when the number of high levels which the respective bits of the internal command CMD_i have should be even and is actually even, the parity check circuit 300 determines that an error has not occurred and disables the error check signal Error_c. The parity check circuit 300 may perform not only a parity check for the internal command CMD_i but also a parity check for an address, etc. Therefore, the second buffer 800 which buffers an external address ADD_e and outputs an internal address ADD_i and the parity check circuit 300 may be electrically coupled with each other.

The precharge signal generation circuit 400 may be inputted with the error check signal Error_c and may generate a precharge signal PREA. For example, the precharge signal generation circuit 400 enables the precharge signal PREA when the error check signal Error_c is enabled. The precharge signal PREA is inputted to the internal circuits (not illustrated) of the semiconductor apparatus 1000, and is a signal which is generated to interrupt operations of the internal circuits being performed for a command in which an error has occurred. Conversely, for example, the precharge signal generation circuit 400 disables the precharge signal PREA when the error check signal Error_c is disabled. If the precharge signal PREA is disabled, the internal circuits perform operations for an inputted command.

Figure 2:
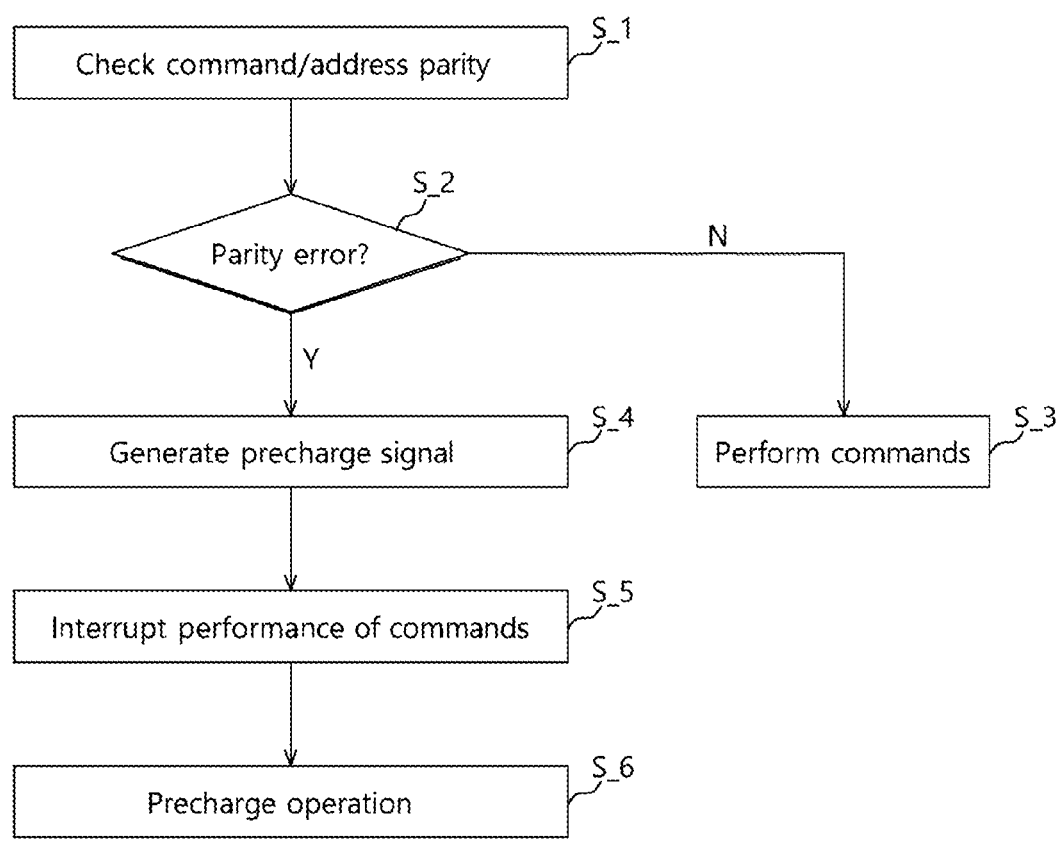
FIG. 2 is a representation of an example of a flow chart to assist in the explanation of the operation of the semiconductor apparatus in accordance with an embodiment.

Operations of the parity check circuit 300 and the precharge signal generation circuit 400 may be summarized as follows, with reference to a flow chart illustrated in FIG. 2.

The parity check circuit 300 performs parity checks for a command and an address (S_1).

A result of performing a parity check operation by the parity check circuit 300 is represented as whether a parity error has occurred or not (S_2).

If a parity check has not occurred (N), the internal circuits of the semiconductor apparatus 1000 execute an inputted command (S_3).

Conversely, if a parity error has occurred (Y), the precharge signal generation circuit 400 generates the precharge signal PREA (S_4). If the precharge signal PREA is generated, the internal circuits of the semiconductor apparatus 1000 interrupt the execution of the inputted command (S_5), and perform a precharge operation (S_6).

The refresh control circuit 500 may be configured to generate a refresh pulse REF_p which is enabled for a predetermined time, during and when the refresh command REF is inputted, that is, the refresh signal REF is enabled. The refresh control circuit 500 may disable the refresh pulse REF_p when the precharge signal PREA is enabled during a period in which the refresh pulse REF_p is enabled. For example, if the precharge signal PREA is enabled during a period in which the refresh pulse REF_p is enabled, the refresh pulse REF_p may be disabled at a time shorter than the predetermined time.

Figure 3:
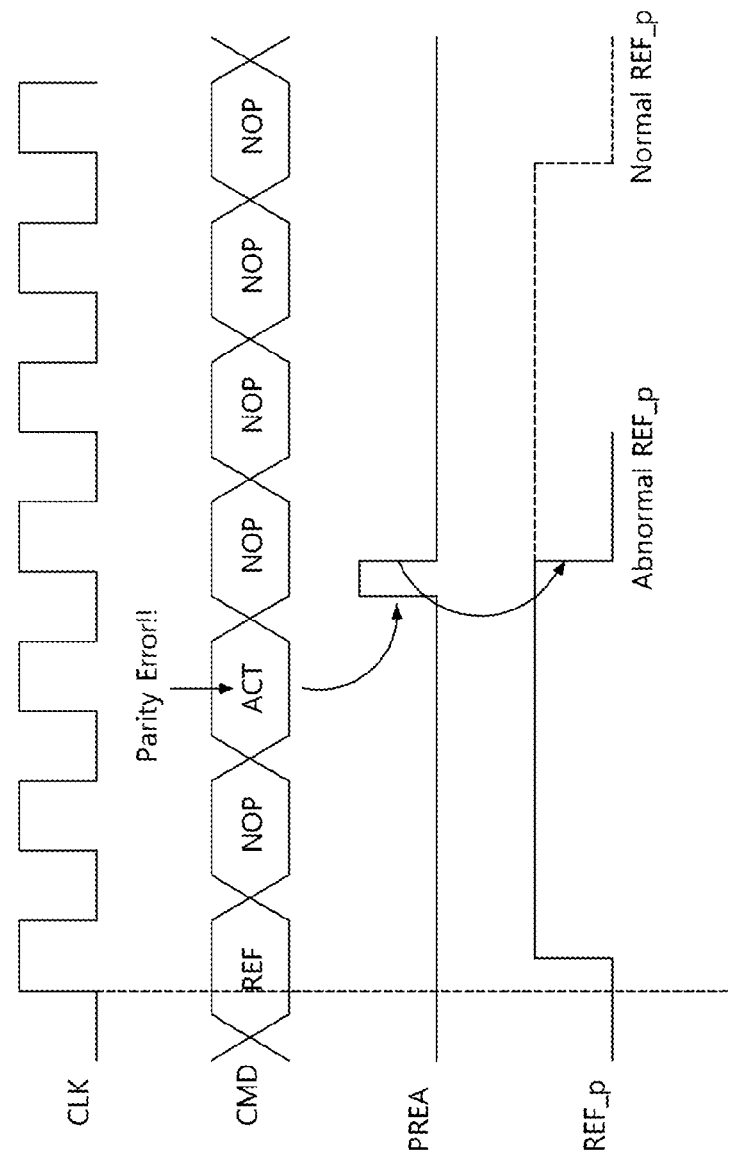
FIG. 3 is a representation of an example of a timing diagram to assist in the explanation of the operation of the semiconductor apparatus in accordance with an embodiment.

FIG. 3 is a representation of an example of a timing diagram to assist in the explanation of the operation of the refresh control circuit 500 for a parity error.

The refresh control circuit 500 enables the refresh pulse REF_p for the predetermined time, during and when the refresh control circuit 500 is inputted with the refresh command REF (see Normal REF_p).

However, if another command after the refresh command REF, for example, an active command ACT is determined as an error in a parity check, the error check signal Error_c is enabled and the precharge signal PREA is enabled. FIG. 3 also illustrates a clock signal CLK and signals NOP. In an embodiment, a parity check result may be performed for not only a command CMD. In an embodiment, a parity check result may be performed on any signal (i.e., first signal) received by the semiconductor apparatus 1000. In an embodiment, a first signal may include, for example but not limited to, an external command CMD_e and/or external address ADD_e, etc.

If the precharge signal PREA is enabled, the refresh control circuit 500 does not retain the enabled refresh pulse REF_p during the predetermined time, and disables the enabled refresh pulse REF_p at a time shorter than the predetermined time (see Abnormal REF_p).

The data storage region 600 performs an active operation during the enable period of the refresh pulse REF_p. The active operation performed during the enable period of the refresh pulse REF_p is an operation in which a memory cell in the data storage region 600 is electrically coupled with a sense amplifier through a bit line. In other words, during the enable period of the refresh pulse REF_p, the data storage region 600 electrically couples a memory cell and a sense amplifier and performs an operation of recovering the potential of the memory cell.

Thus, if the refresh pulse REF_p is normally disabled, as a refresh operation is normally performed, the data storage region 600 may normally retain data. If the refresh pulse REF_p does not retain the enable state during the predetermined time according to the precharge signal PREA generated due to a parity error and is abnormally disabled before the predetermined time, it may be impossible to know whether a normal refresh operation has been performed or not. Namely, it may be necessary to verify whether the refresh pulse REF_p has been enabled for such a time that the refresh operation may be normally performed for the data stored in the data storage region 600.

Accordingly, the refresh verification circuit 700 in accordance with an embodiment is suggested.

The refresh verification circuit 700 may include a filtering circuit 710, a first counting circuit 720, a second counting circuit 730, and a comparison circuit 740.

The filtering circuit 710 may be configured to generate a filtering pulse P_f in response to the size or duration of the enable period of the refresh pulse REF_p. For example, the filtering circuit 710 generates the filtering pulse P_f if the refresh pulse REF_p has retained the enable state during at least a minimum time in which the refresh operation may be normally performed in the data storage region 600. Conversely, for example, the filtering circuit 710 does not generate the filtering pulse P_f if the refresh pulse REF_p has been disabled before the minimum time in which the refresh operation may be normally performed in the data storage region 600.

The configuration and operation of the filtering circuit 710 will be described below with reference to FIG. 4.

The filtering circuit 710 may include a delay section 711, and logic gates, for example but not limited to, a NAND gate ND1, and an inverter IV1. The delay section 711 may be configured to delay the refresh pulse REF_p and generate a delayed refresh pulse REF_pd. The NAND gate ND1 is inputted with the delayed refresh pulse REF_pd and the refresh pulse REF_p. The inverter IV1 is inputted with the output signal of the NAND gate ND1 and outputs the filtering pulse P_f.

A) of FIG. 4 illustrates that the filtering pulse P_f is generated in the example where the refresh pulse REF_p has been enabled during at least the minimum time in which the refresh operation may be normally performed.

The enable period of the refresh pulse REF_p which is enabled during at least the minimum time in which the refresh operation may be normally performed overlaps with the enable period of the delayed refresh pulse REF_pd which is delayed by the delay time of the delay section 711, and the filtering pulse P_f is generated during an enable period through which the refresh pulse REF_p and the delayed refresh pulse REF_pd overlap with each other.

B) of FIG. 4 illustrates that the filtering pulse P_f is not generated in the example where the refresh pulse REF_p has been disabled before the minimum time in which the refresh operation may be normally performed.

The enable period of the refresh pulse REF_p which is disabled before the minimum time in which the refresh operation may be normally performed does not overlap with the enable period of the delayed refresh pulse REF_pd which is delayed by the delay time of the delay section 711. Hence, since an enable period through which the refresh pulse REF_p and the delayed refresh pulse REF_pd overlap with each other does not exist, the filtering pulse P_f is not generated.

Referring again to FIG. 1, the first counting circuit 720 may generate a first counting code CNT_1 in response to the filtering pulse P_f. For example, the first counting circuit 720 increases the code value of the first counting code CNT_1 each time the filtering pulse P_f is inputted.

The second counting circuit 730 may generate a second counting code CNT_2 in response to the refresh command REF. For example, the second counting circuit 730 increases the code value of the second counting code CNT_2 each time the refresh command REF is inputted. For example, the second counting circuit 730 may generate the second counting code CNT_2 in response to the refresh signal REF. For example, the second counting circuit 730 increases the code value of the second counting code CNT_2 each time the refresh signal REF is enabled.

The comparison circuit 740 generates a result signal R_s in response to the first counting code CNT_1 and the second counting code CNT_2. For example, the comparison circuit 740 enables the result signal R_s if the first counting code CNT_1 and the second counting code CNT_2 have the same code value. Conversely, for example, the comparison circuit 740 disables the result signal R_s if the first counting code CNT_1 and the second counting code CNT_2 have different code values.

Examples of operations of a semiconductor apparatus 1000 including a refresh verification circuit 700, configured as mentioned above, will be described below.

The first buffer 100 buffers the external command CMD_e and outputs the internal command CMD_i.

The command decoder 200 decodes the internal command CMD_i and generates the decoding command CMD_dec. The decoding command CMD_dec may include the refresh command REF or the refresh signal REF. Thus, the command decoder 200 generates the refresh command REF if a result of decoding the internal command CMD_i is a command which commands that the refresh operation be performed. In other words, the command decoder 200 enables the refresh signal REF if a result of decoding the internal command CMD_i is a command which commands that the refresh operation be performed.

The parity check circuit 300 performs parity checks for the internal command CMD_i and/or the internal address ADD_i. For example, the parity check circuit 300 generates the error check signal Error_c according to a parity check result for the internal command CMD_i. For example, the parity check circuit 300 enables the error check signal Error_c when it is determined that a parity error exists in the internal command CMD_i and/or the internal address ADD_i. Conversely, the parity check circuit 300 disables the error check signal Error_c when it is determined that a parity error does not exist in the internal command CMD_i and/or internal address ADD_i.

The precharge signal generation circuit 400 enables the precharge signal PREA when the error check signal Error_c is enabled. The precharge signal generation circuit 400 disables the precharge signal PREA when the error check signal Error_c is disabled.

The refresh control circuit 500 generates the refresh pulse REF_p which is enabled for the predetermined time, during and when the refresh command REF is inputted, that is, the refresh signal REF is enabled. The refresh control circuit 500 may disable the refresh pulse REF_p when the precharge signal PREA is enabled during a period in which the refresh pulse REF_p is enabled. For example, if the precharge signal PREA is enabled during a period in which the refresh pulse REF_p is enabled, the refresh pulse REF_p may be disabled at a time shorter than the predetermined time.

The data storage region 600 performs the active operation during the enable period of the refresh pulse REF_p. The active operation performed during the enable period of the refresh pulse REF_p is an operation in which a memory cell in the data storage region 600 is electrically coupled with a sense amplifier through a bit line. In other words, during the enable period of the refresh pulse REF_p, the data storage region 600 electrically couples a memory cell and a sense amplifier and performs an operation of recovering the potential of the memory cell. In an embodiment, during the enable period of the refresh pulse REF_p, the data storage region 600 is allowed to electrically couple a memory cell and a sense amplifier and is allowed to perform an operation of recovering the potential of the memory cell.

Thus, if the refresh pulse REF_p is normally disabled, as the refresh operation is normally performed, the data storage region 600 may normally retain data. If the refresh pulse REF_p does not retain the enable state during the predetermined time according to the precharge signal PREA generated due to a parity error and is abnormally disabled before the predetermined time, it may be impossible to know whether the normal refresh operation has been performed or not. Namely, it may be necessary to verify whether the refresh pulse REF_p has been enabled for such a time that the refresh operation may be normally performed for the data stored in the data storage region 600.

Examples of the operations of the refresh verification circuit 700 will be described below.

The filtering circuit 710 generates the filtering pulse P_f if the refresh pulse REF_p has retained the enable state during at least the minimum time in which the refresh operation may be normally performed in the data storage region 600. Conversely, the filtering circuit 710 does not generate the filtering pulse P_f if the refresh pulse REF_p has been disabled before the minimum time in which the refresh operation may be normally performed in the data storage region 600.

The first counting circuit 720 increases the code value of the first counting code CNT_1 each time the filtering pulse P_f is inputted.

The second counting circuit 730 increases the code value of the second counting code CNT_2 each time the refresh command REF is inputted, that is, each time the refresh signal REF is enabled.

The comparison circuit 740 enables the result signal R_s when the code value of the first counting code CNT_1 and the code value of the second counting code CNT_2 are the same. Conversely, the comparison circuit 740 disables the result signal R_s when the code value of the first counting code CNT_1 and the code value of the second counting code CNT_2 are different from each other.

Summarizing the operation of the refresh verification circuit 700 in accordance with an embodiment, the refresh verification circuit 700 compares the number of times by which the refresh pulse REF_p is generated and the number of times by which the refresh command REF is generated, and outputs a comparison result as the result signal R_s. At this time, whether or not the enable period of the refresh pulse REF_p has been retained during such a time that a refresh may be normally performed is determined by the filtering circuit 710 of the refresh verification circuit 700, and only the refresh pulse REF_p in the example where the enable period of the refresh pulse REF_p has been retained during the time is counted.

As a result, the refresh verification circuit 700 in accordance with an embodiment compares the number of times by which the normally disabled refresh pulse REF_p excluding the abnormally disabled refresh pulse REF_p is inputted according to a result of a parity check and the number of times by which the refresh command REF, that is, the refresh signal REF is enabled, and thereby, performs a verification operation for the refresh operation.

The semiconductor apparatus 1000 including a refresh verification circuit in accordance with an embodiment compares the number of times by which a refresh command generated in response to an external command is inputted and the number of times by which a refresh operation is normally performed, and thereby, performs a verification for the refresh operation.

Figure 5:
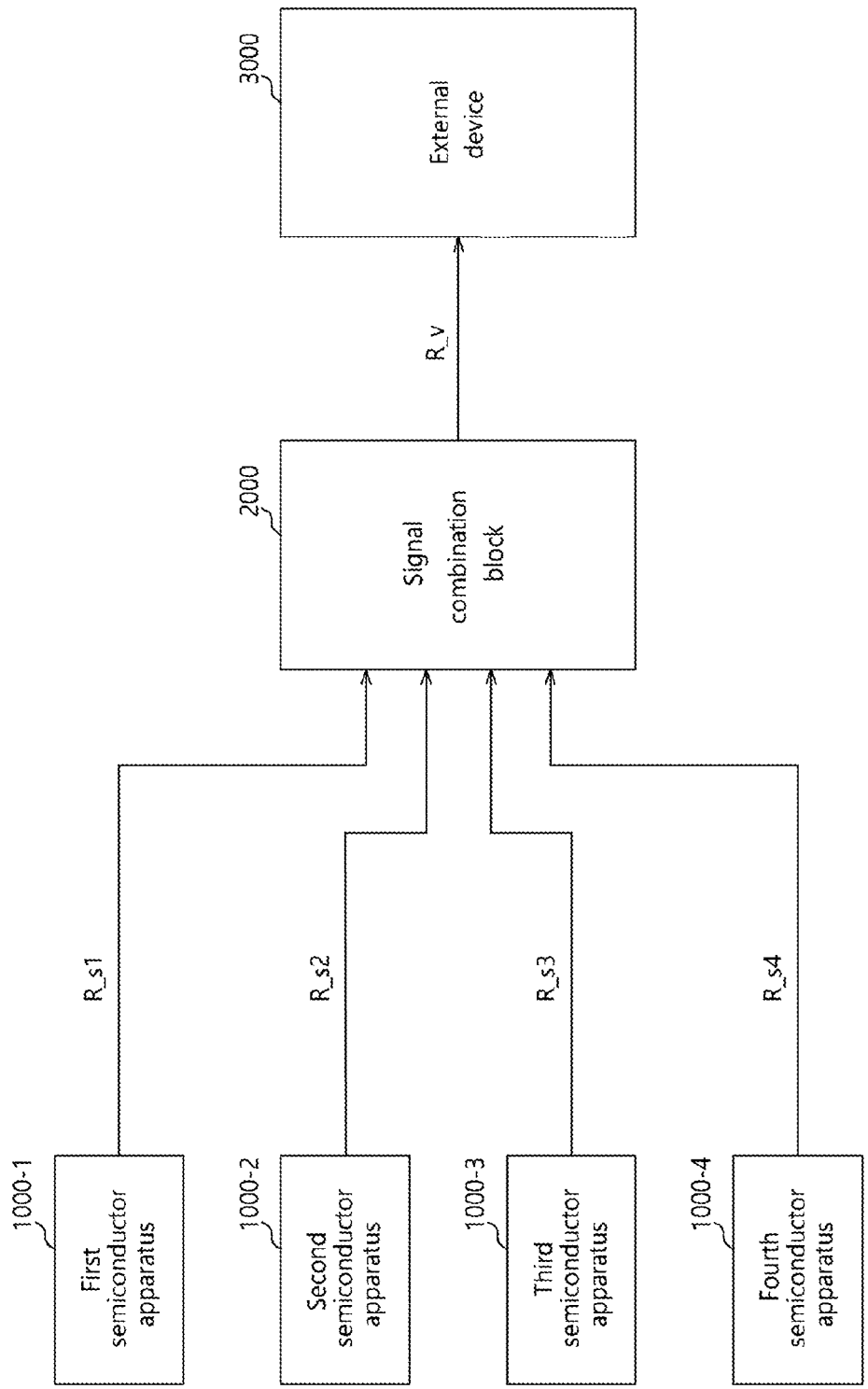
FIG. 5 is a configuration diagram illustrating a representation of an example of a semiconductor system in accordance with an embodiment.

FIG. 5 is a configuration diagram illustrating a representation of an example of a semiconductor system including semiconductor apparatuses in accordance with an embodiment.

A semiconductor system 10000 may include first to fourth semiconductor apparatuses 1000-1, 1000-2, 1000-3 and 1000-4, a signal combination block 2000, and an external device 3000.

As illustrated in FIGS. 1 to 4, each of the first to fourth semiconductor apparatuses 1000-1, 1000-2, 1000-3 and 1000-4 may include a first buffer 100, a command decoder 200, a parity check circuit 300, a precharge signal generation circuit 400, a refresh control circuit 500, a data storage region 600, a refresh verification circuit 700, and a second buffer 800.

The first buffer 100 buffers an external command CMD_e and outputs an internal command CMD_i.

The second buffer 800 buffers an external address ADD_e and outputs an internal address ADD_i.

The command decoder 200 decodes the internal command CMD_i, and enables a refresh signal REF if the internal command CMD_i is a command which commands that a refresh operation be performed.

The parity check circuit 300 performs parity checks for the internal command CMD_i and the internal address ADD_i, and outputs results thereof as an error check signal Error_c.

The precharge signal generation circuit 400 generates a precharge signal PREA in response to the error check signal Error_c. As a result of the parity check for the internal command CMD_i by the parity check circuit 300, if a parity error exists in the internal command CMD_i, the result is transferred to the precharge signal generation circuit 400 as the error check signal Error_c. At this time, the precharge signal generation circuit 400 enables the precharge signal PREA.

The refresh control circuit 500 generates a refresh pulse REF_p in response to the refresh signal REF and the precharge signal PREA. For example, the refresh control circuit 500 generates the refresh pulse REF_p which is enabled for a predetermined time, when the refresh signal REF is enabled. The refresh control circuit 500 disables the refresh pulse REF_p before the predetermined time, when the precharge signal PREA is enabled during the enable period of the refresh pulse REF_p.

The data storage region 600 performs the refresh operation during the enable period of the refresh pulse REF_p. The refresh operation may include an operation in which a memory cell and a sense amplifier are electrically coupled through a bit line. For example, the data storage region 600 electrically couples a memory cell and a sense amplifier through a bit line during the enable period of the refresh pulse REF_p. Since the data storage region 600 performs the refresh operation during the enable period of the refresh pulse REF_p, the data storage region 600 may normally perform the refresh operation only when it is inputted with the refresh pulse REF_p which is enabled during at least a minimum time required for the refresh operation.

The refresh verification circuit 700 may include a filtering circuit 710, first and second counting circuits 720 and 730, and a comparison circuit 740.

The filtering circuit 710 generates a filtering pulse P_f if the refresh pulse REF_p is enabled during at least the minimum time required for the refresh operation. Also, the filtering circuit 710 does not generate the filtering pulse P_f if the refresh pulse REF_p is disabled before the minimum time required for the refresh operation.

The first counting circuit 720 increases the code value of a first counting code CNT_1 each time the filtering pulse P_f is inputted.

The second counting circuit 730 increases the code value of a second counting code CNT_2 each time the refresh signal REF is enabled.

The comparison circuit 740 outputs whether the first and second counting codes CNT_1 and CNT_2 are the same or not, as a result signal R_s.

Summarizing the operation of the refresh verification circuit 700 in accordance with an embodiment, the refresh verification circuit 700 compares the number of times by which the refresh pulse REF_p is generated and the number of times by which the refresh signal REF is enabled, and outputs a comparison result as the result signal R_s. At this time, whether or not the enable period of the refresh pulse REF_p has been retained during such a time that a refresh may be normally performed is determined by the filtering circuit 710 of the refresh verification circuit 700, and only the refresh pulse REF_p in the example where the enable period of the refresh pulse REF_p has been retained during the time is counted.

As a result, the refresh verification circuit 700 in accordance with an embodiment compares the number of times by which the normally disabled refresh pulse REF_p excluding the abnormally disabled refresh pulse REF_p is inputted according to a result of a parity check and the number of times by which the refresh command REF, that is, the refresh signal REF is enabled, and thereby, performs a verification operation for the refresh operation and outputs a result thereof as the result signal R_s.

Therefore, each of the first to fourth semiconductor apparatuses 1000-1, 1000-2, 1000-3 and 1000-4 each including a refresh verification circuit in accordance with an embodiment compares the number of times by which a refresh command generated in response to an external command is inputted and the number of times by which a refresh operation is normally performed, and thereby, performs a verification for the refresh operation.

For example, the first semiconductor apparatus 1000-1 compares the number of times by which a refresh command generated according to an external command is inputted and the number of times by which a refresh operation is normally performed, and outputs a comparison result as a first result signal R_s1.

The second semiconductor apparatus 1000-2 compares the number of times by which a refresh command generated according to an external command is inputted and the number of times by which a refresh operation is normally performed, and outputs a comparison result as a second result signal R_s2.

The third semiconductor apparatus 1000-3 compares the number of times by which a refresh command generated according to an external command is inputted and the number of times by which a refresh operation is normally performed, and outputs a comparison result as a third result signal R_s3.

The fourth semiconductor apparatus 1000-4 compares the number of times by which a refresh command generated according to an external command is inputted and the number of times by which a refresh operation is normally performed, and outputs a comparison result as a fourth result signal R_s4. The first to fourth semiconductor apparatuses 1000-1, 1000-2, 1000-3 and 1000-4 may, for example, be stacked, and may be included in a package with a multi-channel structure.

For example, the signal combination block 2000 enables a refresh verification signal R_v when all of the first to fourth result signals R_s1, R_s2, R_s3 and R_s4 are enabled. For example, the signal combination block 2000 disables the refresh verification signal R_v if even one of the first to fourth result signals R_s1, R_s2, R_s3 and R_s4 is disabled.

The external device 3000 is inputted with the refresh verification signal R_v, and determines whether all of the first to fourth semiconductor apparatuses 1000-1, 1000-2, 1000-3 and 1000-4 have normally performed the refresh operations or even any one of the first to fourth semiconductor apparatuses 1000-1, 1000-2, 1000-3 and 1000-4 has abnormally performed the refresh operation. The external device 3000 may be, for example, test equipment or a controller. The signal combination block 2000 may be, for example, disposed outside the first to fourth semiconductor apparatuses 1000-1, 1000-2, 1000-3 and 1000-4, and may be a circuit which is included in an interface circuit between the first to fourth semiconductor apparatuses 1000-1, 1000-2, 1000-3 and 1000-4 and the external device 3000.

The semiconductor system 10000 in accordance with an embodiment may determine whether all of a plurality of semiconductor apparatuses each including a refresh verification circuit have normally performed refresh operations.

Figure 6:
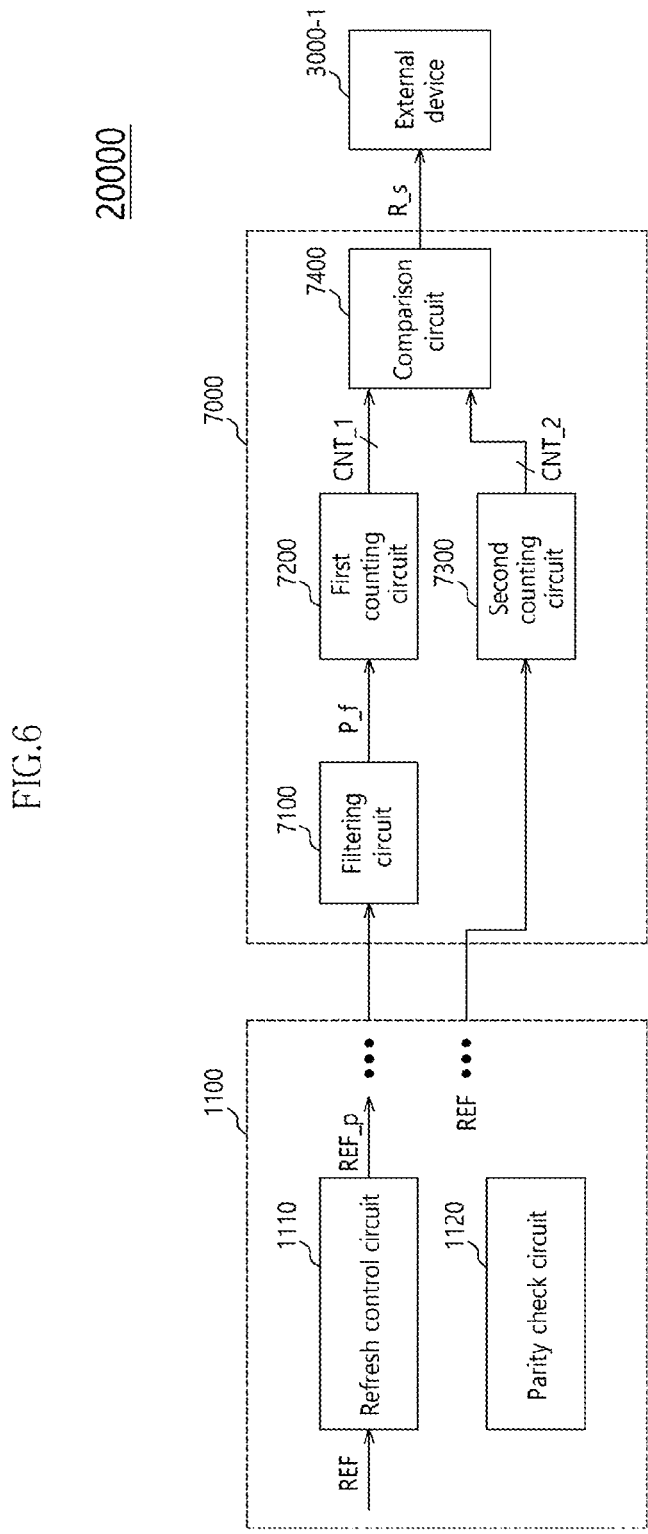
FIG. 6 is a configuration diagram illustrating a representation of an example of a semiconductor system including a refresh verification circuit in accordance with an embodiment.

Referring to FIG. 6, a semiconductor system 20000 in accordance with an embodiment may include a semiconductor apparatus 1100, a refresh verification circuit 7000, and an external device 3000-1.

Referring to FIG. 1, the semiconductor apparatus 1100 may include a first buffer 100, a command decoder 200, a parity check circuit 300, a precharge signal generation circuit 400, a refresh control circuit 500, a data storage region 600, and a second buffer 800. In the semiconductor apparatus 1100, since the refresh verification circuit 7000 the same as the refresh verification circuit 700 illustrated in FIG. 1 is positioned outside the semiconductor apparatus 1100, the semiconductor apparatus 1100 does not include the refresh verification circuit 7000.

Although the semiconductor apparatus 1100 illustrated in FIG. 6 includes all of the first buffer 100, the command decoder 200, the parity check circuit 300, the precharge signal generation circuit 400, the refresh control circuit 500, the data storage region 600 and the second buffer 800 illustrated in FIG. 1, only the refresh control circuit 500 and the parity check circuit 300 are illustrated as a refresh control circuit 1110 and a parity check circuit 1120 in the drawing for the sake of convenience in explanation. The refresh control circuit 1110 and the parity check circuit 1120 illustrated in FIG. 6 may have the same or substantially the same configurations as the refresh control circuit 500 and the parity check circuit 300 illustrated in FIG. 1.

The semiconductor apparatus 1100 includes the refresh control circuit 1110 and the parity check circuit 1120.

The refresh control circuit 1110 generates a refresh pulse REF_p which is enabled during a predetermined time, each time the refresh command REF is inputted. If a parity error for a command is detected in the parity check circuit 1120, the refresh control circuit 1110 may generate the refresh pulse REF_p which is enabled during a time shorter than the predetermined time.

Thus, if a parity error for a command is not detected, the semiconductor apparatus 1100 generates the refresh pulse REF_p which is enabled during the predetermined time, each time the refresh command REF is inputted. Also, if a parity error for a command is detected during a period in which the refresh pulse REF_p is enabled, the semiconductor apparatus 1100 disables the refresh pulse REF_p. That is to say, if a parity error occurs, the refresh pulse REF_p may not retain the enable state during the predetermined time and may be disabled at a time earlier than the predetermined time.

The refresh verification circuit 7000 disposed outside the semiconductor apparatus 1100 may include a filtering circuit 7100, a first counting circuit 7200, a second counting circuit 7300, and a comparison circuit 7400.

The filtering circuit 7100 generates a filtering pulse P_f in response to the size or duration of the enable period of the refresh pulse REF_p. For example, the filtering circuit 7100 generates the filtering pulse P_f if the refresh pulse REF_p has retained the enable state during at least a minimum time in which a refresh operation may be normally performed. Conversely, the filtering circuit 7100 does not generate the filtering pulse P_f if the refresh pulse REF_p has been disabled before the minimum time in which the refresh operation may be normally performed.

Referring to FIG. 4, the filtering circuit 7100 may include a delay section 711, and a logic gate, for example but not limited to, a NAND gate ND1, and an inverter IV1. The delay section 711 delays the refresh pulse REF_p and generates a delayed refresh pulse REF_pd. The NAND gate ND1 is inputted with the delayed refresh pulse REF_pd and the refresh pulse REF_p. The inverter IV1 is inputted with the output signal of the NAND gate ND1 and outputs the filtering pulse P_f.

A) of FIG. 4 illustrates that the filtering pulse P_f is generated in the example where the refresh pulse REF_p has been enabled during at least the minimum time in which the refresh operation may be normally performed.

The enable period of the refresh pulse REF_p which is enabled during at least the minimum time in which the refresh operation may be normally performed overlaps with the enable period of the delayed refresh pulse REF_pd which is delayed by the delay time of the delay section 711, and the filtering pulse P_f is generated during an enable period through which the refresh pulse REF_p and the delayed refresh pulse REF_pd overlap with each other.

B) of FIG. 4 illustrates that the filtering pulse P_f is not generated in the example where the refresh pulse REF_p has been disabled before the minimum time in which the refresh operation may be normally performed.

The enable period of the refresh pulse REF_p which is disabled before the minimum time in which the refresh operation may be normally performed does not overlap with the enable period of the delayed refresh pulse REF_pd which is delayed by the delay time of the delay section 711. Hence, since an enable period through which the refresh pulse REF_p and the delayed refresh pulse REF_pd overlap with each other does not exist, the filtering pulse P_f is not generated.

The first counting circuit 7200 increases the code value of a first counting code CNT_1 each time the filtering pulse P_f is inputted.

The second counting circuit 7300 increases the code value of a second counting code CNT_2 each time the refresh command REF is inputted, that is, each time the refresh signal REF is enabled.

The comparison circuit 7400 enables a result signal R_s when the code values of the first counting code CNT_1 and the second counting code CNT_2 are the same.

The refresh verification circuit 7000 disposed outside the semiconductor apparatus 1100 compares the number of times by which the refresh command REF is inputted in the semiconductor apparatus 1100 and the number of times by which a refresh operation is normally performed, and outputs a comparison result as the result signal R_s.

The external device 3000-1 may determine whether an error has occurred in the refresh operation performed by the semiconductor apparatus 1100, in response to the result signal R_s. The external device 3000-1 may be a controller or test equipment.

The refresh verification circuit 7000 illustrated in FIG. 6 may be disposed, for example, in an interface circuit which electrically couples the semiconductor apparatus 1100 and the external device 3000-1.

Figure 7:
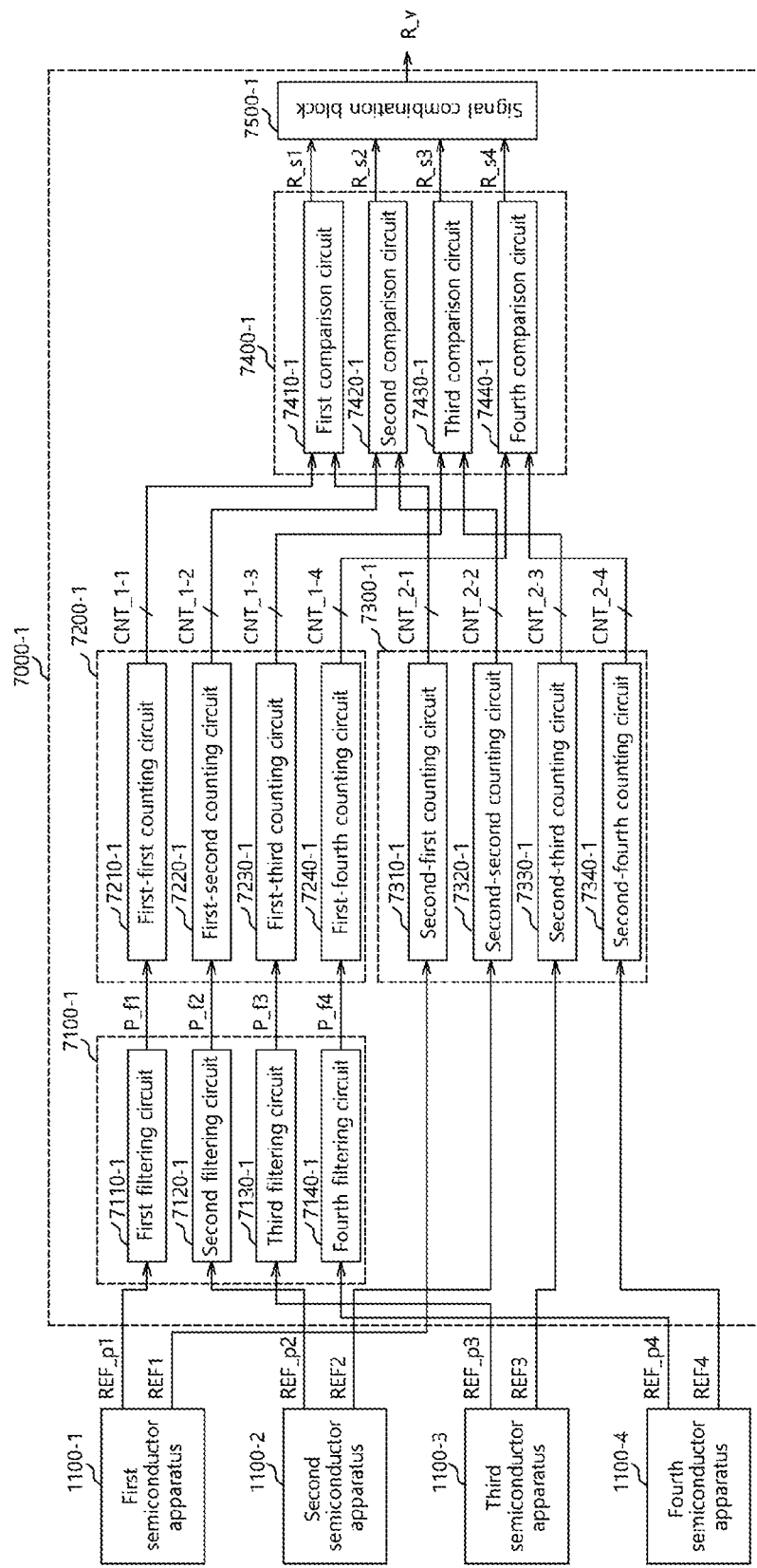
FIG. 7 is a configuration diagram illustrating a representation of an example of a semiconductor system including a refresh verification circuit in accordance with an embodiment.

Referring to FIG. 7, a semiconductor system 30000 in accordance with an embodiment may include first to fourth semiconductor apparatuses 1100-1, 1100-2, 1100-3 and 1100-4, a refresh verification circuit 7000-1, and an external device (not illustrated).

Each of the first to fourth semiconductor apparatuses 1100-1, 1100-2, 1100-3 and 1100-4 may be configured in the same way as the semiconductor apparatus 1100 illustrated in FIG. 6. In other words, each of the first to fourth semiconductor apparatuses 1100-1, 1100-2, 1100-3 and 1100-4 may include all components except the refresh verification circuit 700 in the semiconductor apparatus 1000 illustrated in FIG. 1.

If a parity error for a command is not detected, the first semiconductor apparatus 1100-1 generates a first refresh pulse REF_p1 which is enabled for and/or during a predetermined time, each time a first refresh command REF1 is inputted. Also, if a parity error for a command is detected during a period in which the first refresh pulse REF_p1 is enabled, the first semiconductor apparatus 1100-1 disables the first refresh pulse REF_p1. For example, if a parity error occurs, the first refresh pulse REF_p1 may not retain the enable state during and/or for the predetermined time and may be disabled at a time earlier than the predetermined time.

If a parity error for a command is not detected, the second semiconductor apparatus 1100-2 generates a second refresh pulse REF_p2 which is enabled during and/or for a predetermined time, each time a second refresh command REF2 is inputted. Also, if a parity error for a command is detected during a period in which the second refresh pulse REF_p2 is enabled, the second semiconductor apparatus 1100-2 disables the second refresh pulse REF_p2. For example, if a parity error occurs, the second refresh pulse REF_p2 may not retain the enable state during and/or for the predetermined time and may be disabled at a time earlier than the predetermined time.

If a parity error for a command is not detected, the third semiconductor apparatus 1100-3 generates a third refresh pulse REF_p3 which is enabled during and/or for a predetermined time, each time a third refresh command REF3 is inputted. Also, if a parity error for a command is detected during a period in which the third refresh pulse REF_p3 is enabled, the third semiconductor apparatus 1100-3 disables the third refresh pulse REF_p3. For example, if a parity error occurs, the third refresh pulse REF_p3 may not retain the enable state during and/or for the predetermined time and may be disabled at a time earlier than the predetermined time.

If a parity error for a command is not detected, the fourth semiconductor apparatus 1100-4 generates a fourth refresh pulse REF_p4 which is enabled during and/or for a predetermined time, each time a fourth refresh command REF4 is inputted. Also, if a parity error for a command is detected during a period in which the fourth refresh pulse REF_p4 is enabled, the fourth semiconductor apparatus 1100-4 disables the fourth refresh pulse REF_p4. For example, if a parity error occurs, the fourth refresh pulse REF_p4 may not retain the enable state during and/or for the predetermined time and may be disabled at a time earlier than the predetermined time.

The refresh verification circuit 7000-1 may include a filtering group 7100-1, a first counting group 7200-1, a second counting group 7300-1, a comparison group 7400-1, and a signal combination block 7500-1.

The filtering group 7100-1 may include, for example but not limited to, first to fourth filtering circuits 7110-1, 7120-1, 7130-1 and 7140-1.

The first filtering circuit 7110-1 generates a first filtering pulse P_f1 in response to the size or duration of the enable period of the first refresh pulse REF_p1. For example, the first filtering circuit 7110-1 generates the first filtering pulse P_f1 if the first refresh pulse REF_p1 has retained the enable state during at least a minimum time in which a refresh operation may be normally performed. Also, the first filtering circuit 7110-1 does not generate the first filtering pulse P_f1 if the first refresh pulse REF_p1 is disabled before the minimum time in which the refresh operation may be normally performed.

The second filtering circuit 7120-1 generates a second filtering pulse P_f2 in response to the size or duration of the enable period of the second refresh pulse REF_p2. For example, the second filtering circuit 7120-1 generates the second filtering pulse P_f2 if the second refresh pulse REF_p2 has retained the enable state during at least a minimum time in which a refresh operation may be normally performed. Also, the second filtering circuit 7120-1 does not generate the second filtering pulse P_f2 if the second refresh pulse REF_p2 is disabled before the minimum time in which the refresh operation may be normally performed.

The third filtering circuit 7130-1 generates a third filtering pulse P_f3 in response to the size or duration of the enable period of the third refresh pulse REF_p3. For example, the third filtering circuit 7130-1 generates the third filtering pulse P_f3 if the third refresh pulse REF_p3 has retained the enable state during at least a minimum time in which a refresh operation may be normally performed. Also, the third filtering circuit 7130-1 does not generate the third filtering pulse P_f3 if the third refresh pulse REF_p3 is disabled before the minimum time in which the refresh operation may be normally performed.

The fourth filtering circuit 7140-1 generates a fourth filtering pulse P_f4 in response to the size or duration of the enable period of the fourth refresh pulse REF_p4. For example, the fourth filtering circuit 7140-1 generates the fourth filtering pulse P_f4 if the fourth refresh pulse REF_p4 has retained the enable state during at least a minimum time in which a refresh operation may be normally performed. Also, the fourth filtering circuit 7140-1 does not generate the fourth filtering pulse P_f4 if the fourth refresh pulse REF_p4 is disabled before the minimum time in which the refresh operation may be normally performed.

The respective configurations of the first to fourth filtering circuits 7110-1, 7120-1, 7130-1 and 7140-1 are the same except that only the signals inputted thereto and only the signals outputted therefrom are different. Referring to FIG. 4, each of the first to fourth filtering circuits 7110-1, 7120-1, 7130-1 and 7140-1 may include a delay section 711, and a logic gate, for example but not limited to, a NAND gate ND1, and an inverter IV1.

The first counting group 7200-1 may include a first-first counting circuit 7210-1, a first-second counting circuit 7220-1, a first-third counting circuit 7230-1 and a first-fourth counting circuit 7240-1.

The first-first counting circuit 7210-1 increases the code value of a first-first counting code CNT_1-1 each time the first filtering pulse P_f1 is inputted.

The first-second counting circuit 7220-1 increases the code value of a first-second counting code CNT_1-2 each time the second filtering pulse P_f2 is inputted.

The first-third counting circuit 7230-1 increases the code value of a first-third counting code CNT_1-3 each time the third filtering pulse P_f3 is inputted.

The first-fourth counting circuit 7240-1 increases the code value of a first-fourth counting code CNT_1-4 each time the fourth filtering pulse P_f4 is inputted.

The second counting group 7300-1 may include a second-first counting circuit 7310-1, a second-second counting circuit 7320-1, a second-third counting circuit 7330-1 and a second-fourth counting circuit 7340-1.

The second-first counting circuit 7310-1 increases the code value of a second-first counting code CNT_2-1 each time the first refresh command REF1 is inputted.

The second-second counting circuit 7320-1 increases the code value of a second-second counting code CNT_2-2 each time the second refresh command REF2 is inputted.

The second-third counting circuit 7330-1 increases the code value of a second-third counting code CNT_2-3 each time the third refresh command REF3 is inputted.

The second-fourth counting circuit 7340-1 increases the code value of a second-fourth counting code CNT_2-4 each time the fourth refresh command REF4 is inputted.

The comparison group 7400-1 may include first to fourth comparison circuits 7410-1, 7420-1, 7430-1 and 7440-1.

The first comparison circuit 7410-1 enables a first result signal R_s1 when the code values of the first-first counting code CNT_1-1 and the second-first counting code CNT_2-1 are the same. The first comparison circuit 7410-1 disables the first result signal R_s1 when the code values of the first-first counting code CNT_1-1 and the second-first counting code CNT_2-1 are different.

The second comparison circuit 7420-1 enables a second result signal R_s2 when the code values of the first-second counting code CNT_1-2 and the second-second counting code CNT_2-2 are the same. The second comparison circuit 7420-1 disables the second result signal R_s2 when the code values of the first-second counting code CNT_1-2 and the second-second counting code CNT_2-2 are different.

The third comparison circuit 7430-1 enables a third result signal R_s3 when the code values of the first-third counting code CNT_1-3 and the second-third counting code CNT_2-3 are the same. The third comparison circuit 7430-1 disables the third result signal R_s3 when the code values of the first-third counting code CNT_1-3 and the second-third counting code CNT_2-3 are different.

The fourth comparison circuit 7440-1 enables a fourth result signal R_s4 when the code values of the first-fourth counting code CNT_1-4 and the second-fourth counting code CNT_2-4 are the same. The fourth comparison circuit 7440-1 disables the fourth result signal R_s4 when the code values of the first-fourth counting code CNT_1-4 and the second-fourth counting code CNT_2-4 are different.

For example, the signal combination block 7500-1 enables a refresh verification signal R_v when all of the first to fourth result signals R_s1, R_s2, R_s3 and R_s4 are enabled. For example, the signal combination block 7500-1 disables the refresh verification signal R_v if even any one of the first to fourth result signals R_s1, R_s2, R_s3 and R_s4 is disabled.

The refresh verification signal R_v may be inputted to the external device.

The semiconductor system in accordance with an embodiment may test at once whether a plurality of semiconductor apparatuses have performed an abnormal refresh operation due to a parity error for a command.

Describing this again, the semiconductor system in accordance with an embodiment includes a refresh verification circuit which may be disposed between or coupled between a plurality of semiconductor apparatuses and an external device. The refresh verification circuit may verify whether all of the plurality of semiconductor apparatuses have normally performed refresh operations. The refresh verification circuit disposed between or coupled between the plurality of semiconductor apparatuses and the external device may be disposed on an interface which electrically couples the plurality of semiconductor apparatuses and the external device.

While various embodiments have been described above, it will be understood to those skilled in the art that the embodiments described are examples only. Accordingly, the refresh verification circuit, the semiconductor apparatus and the semiconductor system described herein should not be limited based on the described embodiments.

What is claimed is:

1. A semiconductor apparatus comprising:
   a refresh control circuit configured to generate a refresh pulse in response to a refresh command and a precharge signal;
   a precharge signal generation circuit configured to generate the precharge signal according to a parity check result for a first signal; and
   a refresh verification circuit configured to generate a result signal in response to the refresh pulse and the refresh command.

2. The semiconductor apparatus according to claim 1, wherein the refresh control circuit generates the refresh pulse which is enabled when the refresh command is inputted, and disables the refresh pulse when the precharge signal is enabled during an enable period of the refresh pulse.

3. The semiconductor apparatus according to claim 1, wherein the precharge signal generation circuit generates the precharge signal when the parity check result for the first signal is a parity error.

4. The semiconductor apparatus according to claim 2, wherein the refresh verification circuit comprises:
   a filtering circuit configured to generate a filtering pulse in response to a duration of the enable period of the refresh pulse;
   a first counting circuit configured to increase a code value of a first counting code each time the filtering pulse is inputted;
   a second counting circuit configured to increase a code value of a second counting code each time the refresh command is inputted; and
   a comparison circuit configured to enable the result signal when the code value of the first counting code and the code value of the second counting code are the same.

5. The semiconductor apparatus according to claim 4, wherein the filtering circuit generates a delayed refresh pulse by delaying the refresh pulse, and generates the filtering pulse during a period in which the enable period of the refresh pulse and an enable period of the delayed refresh pulse overlap with each other.

* * * * *